(12) United States Patent
Grobelny et al.

(10) Patent No.: US 8,987,066 B2
(45) Date of Patent: Mar. 24, 2015

(54) PROCESSING UNIT COMPRISING INTEGRATED CIRCUITS INCLUDING A COMMON CONFIGURATION OF ELECTRICAL INTERCONNECTS

(75) Inventors: Eric Grobelny, St. Petersburg, FL (US); David Paul Campagna, St. Petersburg, FL (US); David J. Kessler, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 355 days.

(21) Appl. No.: 13/342,707

(22) Filed: Jan. 3, 2012

(65) Prior Publication Data
US 2013/0171777 A1   Jul. 4, 2013

(51) Int. Cl.
*H01L 21/82* (2006.01)
*H01L 21/8234* (2006.01)
*H01L 25/065* (2006.01)
(Continued)

(52) U.S. Cl.
CPC .... *H01L 25/0657* (2013.01); *H01L 21/823475* (2013.01); *H01L 23/481* (2013.01); *H01L 25/18* (2013.01); *H01L 2225/06544* (2013.01); *H01L 2225/06565* (2013.01); *H01L 2924/00* (2013.01); *H01L 2924/00012* (2013.01); *H01L 2924/0002* (2013.01)
USPC ............................ 438/128; 257/777; 438/107

(58) Field of Classification Search
CPC ...................... H01L 23/49827; H01L 23/5384; H01L 23/4012; H01L 2225/06541; H01L 2224/24135; H01L 25/0652; H01L 25/0657; H01L 25/16; H01L 33/382
USPC ............. 257/777; 700/96, 118, 121; 438/107, 438/128
See application file for complete search history.

(56) References Cited

U.S. PATENT DOCUMENTS

| | | |
|---|---|---|
| 6,178,494 B1 | 1/2001 | Casselman |
| 7,138,722 B2 | 11/2006 | Miyamoto et al. |
| 7,159,047 B2 | 1/2007 | Klecka et al. |

(Continued)

FOREIGN PATENT DOCUMENTS

WO    2007/029253 A2    3/2007

OTHER PUBLICATIONS

Loh, "A Modular 3D Processor for Flexible Product Design and Technology Migration," In the Proceedings of the ACM International Conference on Computing Frontiers, May 2008, pp. 1-12 (12 pages).

(Continued)

*Primary Examiner* — Peniel M Gumedzoe
(74) *Attorney, Agent, or Firm* — Shumaker & Sieffert, P.A.

(57) ABSTRACT

A processing unit comprises a plurality of individual integrated circuits (ICs) electrically connected to one another via a common configuration of electrical interconnects (e.g., through-silicon vias). At least two of the ICs may be configured for a different function. In some examples, the processing unit is formed by selecting the ICs from stored groups of ICs. The stored ICs can be, for example, modular ICs in that the ICs can be mixed and matched in any suitable number or type in order to meet a particular set of functional requirements for the processing unit, which may depend on the application for the processing unit. Electrical coupling of these individual ICs via the electrical interconnects of the ICs results in a single processing unit that is configured to perform functions specifically suited for a particular application or set of applications.

20 Claims, 6 Drawing Sheets

(51) Int. Cl.
　　　*H01L 23/48*　　(2006.01)
　　　*H01L 25/18*　　(2006.01)

(56) References Cited

U.S. PATENT DOCUMENTS

| | | |
|---|---|---|
| 7,615,857 B1 | 11/2009 | Jouppi |
| 7,683,459 B2 | 3/2010 | Ma et al. |
| 7,750,488 B2 | 7/2010 | Patti et al. |
| 7,812,458 B2 | 10/2010 | Madurawe |
| 7,898,095 B2 | 3/2011 | Patti et al. |
| 2005/0054140 A1* | 3/2005 | Kim et al. ............... 438/109 |
| 2006/0087013 A1* | 4/2006 | Hsieh ..................... 257/678 |
| 2009/0001541 A1 | 1/2009 | Covert et al. |
| 2010/0109096 A1 | 5/2010 | Osada et al. |
| 2010/0185410 A1 | 7/2010 | Bartley et al. |
| 2010/0233850 A1 | 9/2010 | Patti et al. |
| 2011/0042825 A1 | 2/2011 | Ito et al. |
| 2011/0057327 A1* | 3/2011 | Yoshida et al. ............... 257/777 |
| 2011/0079924 A1* | 4/2011 | Suh ..................... 257/777 |
| 2011/0147909 A1* | 6/2011 | Hsuan et al. ............... 257/686 |

OTHER PUBLICATIONS

"FaStack(R) Creates 3D Integrated Circuits (3D-ICs)", Tezzaron Semiconductor, 3 pages, downloaded on May 16, 2011, downloadable from http:www.tezzaron.com/techology/FaStack.html.

* cited by examiner

PROCESSING UNIT COMPRISING INTEGRATED CIRCUITS INCLUDING A COMMON CONFIGURATION OF ELECTRICAL INTERCONNECTS

TECHNICAL FIELD

The disclosure relates to processing units.

BACKGROUND

Some processing units may include a variety of types of components, depending upon the specific application for which they are intended.

SUMMARY

In general, the disclosure is directed to devices, systems, and techniques for forming a processing unit that comprises individual integrated circuits electrically coupled to one another via a common configuration of electrical interconnects. The integrated circuits may, for example, be stacked to define the processing unit. In some examples, at least two of the integrated circuits of the processing unit have different functions. In some examples, the individual integrated circuits are selected from stored groups of respective types (e.g., functions, such as processing, storage, input-output, and device management) of integrated circuits to support a specific application for the processing unit. A plurality of processing units configured for different applications may be formed from integrated circuits of the stored groups of individual integrated circuits. In this way, a processing unit comprising integrated circuits selected from the stored groups of integrated circuits may be formed from modular building blocks (integrated circuits). The configuration of electrical interconnects shared by the stored integrated circuits enables different types of integrated circuits to be stacked with each other in a plurality of different configurations to support a plurality of different applications.

In one example, the disclosure is directed to a method comprising selecting a first individual integrated circuit from a first group of individual integrated circuits, wherein each integrated circuit of the first group is configured to perform a first function; selecting a second individual integrated circuit from a second group of individual integrated circuits, wherein each integrated circuit of the second group is configured to perform a second function different than the first function, and wherein each integrated circuit of the first and second groups comprises a plurality of interconnects arranged in a predetermined configuration; and electrically coupling the plurality of interconnects of the first integrated circuit to the plurality of interconnects of the second integrated circuit, wherein electrically coupling the plurality of interconnects of the first integrated circuit to the plurality of interconnects of the second integrated circuit facilitates transmission of at least one common electrical signal through the first and second integrated circuits via the plurality of interconnects.

In another example, the disclosure is directed to a system comprising a first group of individual integrated circuits, wherein each integrated circuit of the first group is configured to perform a first function; a second group of individual integrated circuits, wherein each integrated circuit of the second group is configured to perform a second function different than the first function, wherein each integrated circuit of the first and second groups comprises a plurality of interconnects arranged in a predetermined configuration; a user interface configured to receive input from a user selecting characteristics of a processing unit; a movable arm; and a processor configured to control the movable arm to select a first individual integrated circuit from the first group of individual integrated circuits based on the received input and control the movable arm to select a second individual integrated circuit from the second group of individual integrated circuits based on the received input.

In another example, the disclosure is directed to a system comprising means for selecting a first individual integrated circuit from a first group of individual integrated circuits, wherein each integrated circuit of the first group is configured to perform a first function; means for selecting a second individual integrated circuit from a second group of individual integrated circuits, wherein each integrated circuit of the second group is configured to perform a second function different than the first function, and wherein each integrated circuit of the first and second groups comprises a plurality of interconnects arranged in a predetermined configuration; and means for electrically coupling the plurality of interconnects of the first integrated circuit to the plurality of interconnects of the second integrated circuit, wherein electrically coupling the plurality of interconnects of the first integrated circuit to the plurality of interconnects of the second integrated circuit facilitates transmission of at least one common electrical signal through the first and second integrated circuits via the plurality of interconnects.

In another aspect, the disclosure is directed to a computer-readable storage medium, which may be an article of manufacture. The computer-readable storage medium includes computer-readable instructions for execution by a processor. The instructions cause a programmable processor to perform any part of the techniques described herein. The instructions may be, for example, software instructions, such as those used to define a software or computer program. The computer-readable medium may be a computer-readable storage medium such as a storage device (e.g., a disk drive, or an optical drive), memory (e.g., a Flash memory, read only memory (ROM), or random access memory (RAM)) or any other type of volatile or non-volatile memory that stores instructions (e.g., in the form of a computer program or other executable) to cause a programmable processor to perform the techniques described herein.

The details of one or more examples are set forth in the accompanying drawings and the description below. Other features, objects, and advantages of the disclosure will be apparent from the description and drawings, and from the claims.

DETAILED DESCRIPTION

In some examples, a processing unit described herein is defined by a plurality of individual integrated circuits (ICs)

electrically connected to one another via a common configuration of electrical interconnects (e.g., through-silicon vias). At least two of the ICs may have a different function, such as processing, storage (e.g., memory), input/output, or device management. Example devices, systems, and techniques for forming the processing unit by selecting the ICs from stored (and formed prior to the formation of the processing unit) groups of ICs are also described herein. The stored ICs can be, for example, modular ICs in that the ICs can be mixed and matched in any suitable number or type in order to meet a particular set of functional requirements for the processing unit, which may depend on the application for the processing unit. Electrical coupling of these individual ICs via the electrical interconnects of the ICs results in a single processing unit that is configured to perform functions specifically suited for a particular application or set of applications.

Each of the individual stored ICs may include a common configuration of electrical interconnects (e.g., through silicon vias), and, as a result, any ICs of the stored ICs can be electrically connected to each other by stacking the ICs such that the interconnects of one IC lines up with the interconnects of another IC and the interconnects of one IC contact the interconnects of another IC (directly or indirectly, e.g., via a conductive interface material). When electrically connected, the electrical interconnects transmit electrical signals (e.g., communication signals) between the individual stacked ICs. In some examples, this common configuration of electrical interconnects may be referred to herein as an open interconnect. The open interconnect may promote expandability of a processing unit including the ICs with the common configuration of electrical interconnects because additional ICs may be easily incorporated into an already-assembled or partially assembled processing unit to enhance functionality of an existing system by stacking the additional ICs (e.g., with additional functionality) on top of the ICs of the existing processing unit.

The processing unit and techniques for forming the processing unit described herein may provide one or more advantages. The stackable nature of the individual ICs described herein while the ICs are already diced (e.g., not in wafer form in which a plurality of ICs are mechanically connected to each other) may support the development of highly capable devices while overcoming cost, timing, and yield concerns associated with building large, monolithic designs. In addition, the ability to assemble application-specific processing stages using the individual ICs may promote design flexibility by allowing designers to mix and match individual ICs of varying function to best suit the needs of their applications. For example, the techniques for fabricating processing units described herein may enable the quantity of signal processing resources in a single processing unit to be increased relatively easily and without requiring the design of a new IC because the processing throughput of the processing unit can be increased by increasing the number of individual ICs configured for data processing included in the processing unit. Because the processing capability of the processing unit may be scaled based on the number of ICs configured for data processing, a more powerful data processor can be configured relatively easily by customizing a processing unit to include a plurality of ICs configured for data processing.

In some examples, the reliability of the application-specific processing units may be improved because the stackable nature of the individual ICs may enable individual components (e.g., individual ICs or a subset of the ICs) of the processing units to be tested, rather than having to test a single, complex processing unit after assembly of a plurality of integrated circuits. The individual components can be tested prior to stacking the ICs to define the processing unit. In contrast, a processing unit formed from a plurality of ICs that are stacked on a wafer level (i.e., prior to dicing the wafer) may be tested after the ICs are stacked, which may increase the complexity with which a problem with the processing unit is identified (e.g., identifying which IC is the source of a detected problem).

In addition, in examples in which the processing units are utilized in aerospace applications, the processing units described herein may address software development concerns of the space community associated with legacy code and multi-core architectures. For example, a processing unit formed in accordance with the techniques described herein may include a first individual IC with a first set of main processing capabilities (such as an individual IC that includes a Performance Optimization With Enhanced RISC—Performance Computing (PowerPC) instruction set architecture, a x86 instruction set architecture, or another suitable type of instruction set architecture configured for main or general processing capabilities) and at least one other individual IC with processing capabilities different from the first individual IC, such as one or more Special Purpose Processors (SPPs). In this way, the processing unit may facilitate running code developed for a specific type of main processor (e.g., Power PC or x86), while also allowing for integration of additional processing capabilities via the at least one other individual IC (e.g., one or more SPPs). This may, for example, help reduce cost and risk while still utilizing more capable processors and advanced input/output in the processing unit. In other words, in some examples, the processing units described herein may allow users to run legacy code designed for a specific type of processor "out-of-the-box" and still reap the benefits of system-on-chip architecture, high-performance memory interfaces, and improved processor architecture. In order to increase performance and efficiency, key subtasks may later be moved from the main processing individual IC to one or more SPPs.

Figure 1:
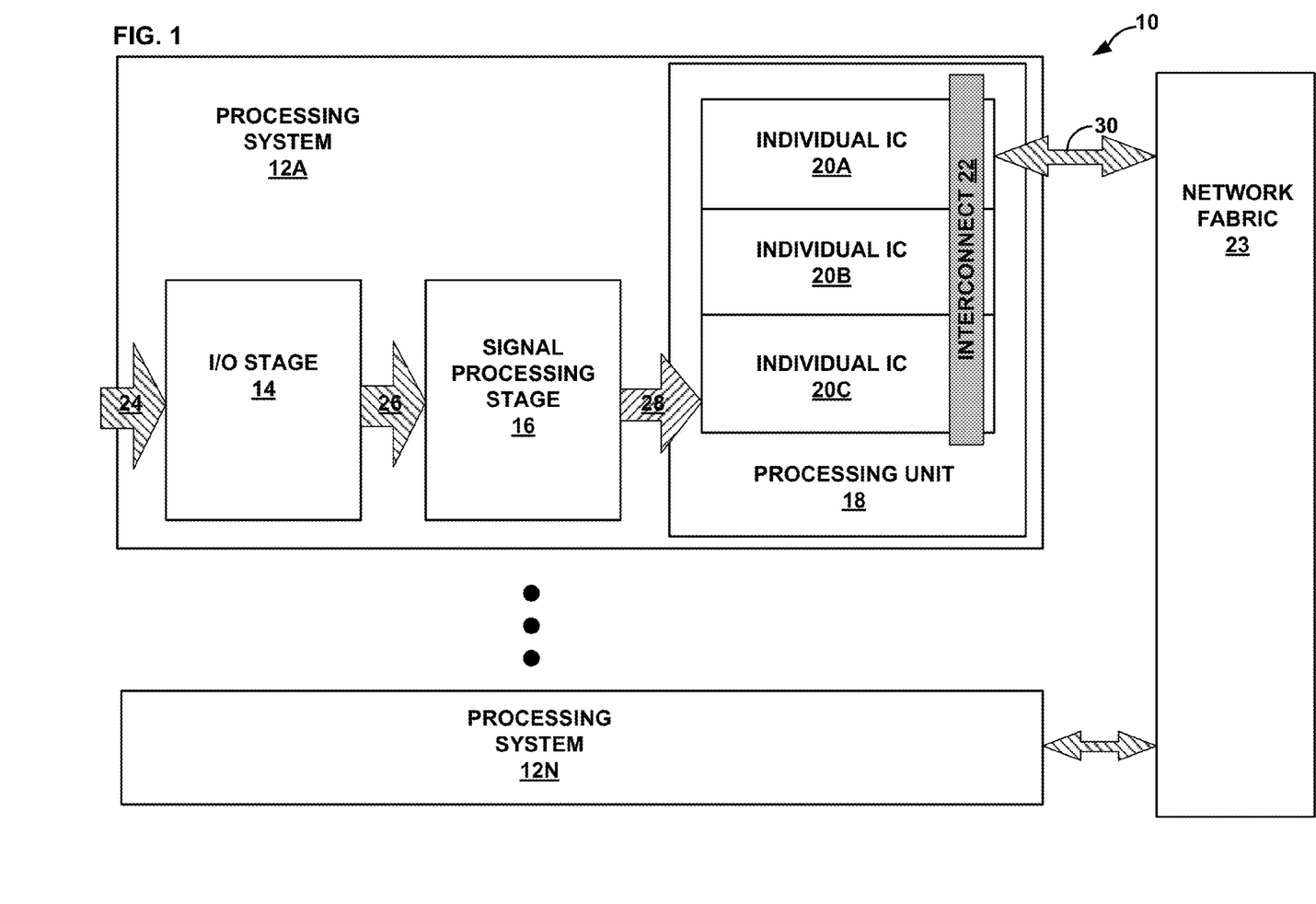
FIG. 1 is a schematic diagram illustrating an example processing system that includes an example processing unit formed from modular integrated circuits (ICs).

FIG. 1 illustrates an example computing system 10, which may be configured to perform various signal processing operations. The schematic diagram of FIG. 1 illustrates an example system architecture that includes processing systems 12A-12N interconnected by network fabric 23, which may be, in some examples, a serial, packet-switched network fabric. Interconnecting processing systems 12A-12N with network fabric 23 may configure system 10 such that processing capabilities of system 10 can be physically partitioned to best meet application needs.

In the example shown in FIG. 1, processing system 12A includes input/output (I/O) stage 14, signal processing stage 16, and data processing unit 18 (which may define a data processing stage of processing system 12A). In the example illustrated in FIG. 1, data processing unit 18 includes three individual integrated circuits (ICs) 20A, 20B, and 20C configured to perform different functions and electrically coupled to one another via interconnect 22 (which may also be referred to herein as open interconnect 22). In other examples, two of the ICs 20A-20C may be configured to perform the same function. In the example shown in FIG. 1, interconnect 22 is defined by electrical interconnects of the ICs 20A-20C that are electrically connected to each other.

In the example shown in FIG. 1, processing system 12A may be configured for a particular application to process signal data. Arrows 24, 26, 28, 30, and 32, shown in FIG. 1, represent the flow of the signal data through processing system 12A during various stages of processing. As illustrated, processing system 12A includes I/O stage 14 configured to receive the data, e.g., as illustrated by arrow 24. I/O stage 14 may be configured to receive the signal data, translate the signal data into an appropriate format for receipt by signal processing stage 16, and transmit the signal data to signal processing stage 16, e.g., as illustrated by arrow 26. Signal processing stage 16 may be configured to prepare the data for processing unit 18 (e.g., by formatting, conditioning, filtering, reducing or otherwise preparing the data for processing by unit 18) and to transmit the prepared signal data to processing unit 18, e.g., as illustrated by arrow 28. Data processing unit 18 may be configured to process the signal data received from signal processing stage 16 in an application-specific manner. For example, individual ICs 20A-20B and other components of data processing unit 18 may be specifically selected based on a particular application and, thus, may be configured to process the received signal data in a manner consistent with the particular application.

In some examples, I/O stage 14 and/or signal processing stage 16 may be physically separate devices electrically coupled to one another and to processing unit 18. In other examples, I/O stage 14 and/or signal processing stage 16 may be housed in a common housing with processing unit 18 and may be electrically couple to one another and to data processing unit 18 within the common housing.

Although FIG. 1 illustrates a particular example configuration of a computing system 10, other configurations are contemplated. For example, system 10 may include any suitable number of processing systems 12, each of which may include any suitable number and configuration of processing units 18. Processing system 12A may include different types and configurations of stages than those illustrated in FIG. 1. For example, processing unit 12A may not include I/O stage 14 and/or signal processing stage 16, in some examples. In addition, in some examples, processing unit 18 may include a different number of individual ICs than illustrated in FIG. 1. For example, processing unit 18 may include less than three individual ICs, e.g., one or two individual ICs, or may include more than three individual ICs, e.g., four or more individual ICs, depending upon the application for which processing unit 18 is configured.

I/O stage 14 may be configured in any manner suitable for receiving the signal data and translating the signal data into an appropriate format to be received by the signal processing stage 16. For example, in some examples, I/O stage 14 may be implemented as an application specific I/O mezzanine card containing a physical interface to sources of raw data (e.g., sensors, radios, and/or other sources of raw data) that system 10 may process. In some examples, I/O stage 14 includes drivers, buffers, serializer/deserializer, and/or other components that may be used translate the application specific I/O into the standard interfaces used to feed signal processing stage 16.

Signal processing stage 16 may be configured in any manner suitable for receiving the data from I/O stage 14 and formatting, conditioning, filtering, reducing, or otherwise preparing the data for data processing unit 18. For example, signal processing stage 16 may include, for example, a field programmable gate array (FPGA). In some examples in which system 10 is used in space applications, the FPGA may be configured to be radiation hardened or radiation tolerant. For example, signal processing stage 16 may include a radiation-hardened (rad-hard) or radiation-tolerant (rad-tolerant) reconfigurable computing technology such as a Xilinx® SEU Immune Reconfigurable FPGA (SIRF), made commercially available by Xilinx, Inc. of San Jose, Calif. The architecture of data processing system 12A may, in some examples, include dedicated high-speed interfaces between signal processing stage 16 and data processing unit 18.

Processing unit 18 may be configured to receive the data processed by signal processing stage 16, and further process the data in an application-specific manner. In the example illustrated in FIG. 1, processing unit 18 supports three layers of software driven data processing, e.g., via individual ICs 20A-20C. For example, a first layer provided by one of the ICs 20A-20C may be a special purpose processor (SPP) that is configured to receive data directly from a dedicated interface to signal processing stage 16 and perform a first stage of software processing on the data. Example processing tasks include, for example, assembling data in an internal or external memory for use by another layer of processing unit 18 and/or more complex filtering of the data, such as adaptic heuristic filtering. In this example, the second layer provided by a different one of the ICs 20A-20C can be, for example, a superscalar general purpose processor that executes a specific algorithm using the data from the first layer. In addition, in some examples, the third layer provided by a different one of the ICs 20A-20C can be an embedded (internal) memory or a network interface that is used to communicate processed data to other processing systems.

Each of the individual ICs 20A-20C may be specifically selected based on the application for which processing system 12A, processing unit 18 or both are intended. For example, each of the individual ICs 20A-20C may have different functions, and the combination of the different functions of individual ICs 20A-20C may allow processing unit 18 to process the data for a specific application.

As described in further detail below, each individual IC 20A-20C may have any function suitable for the particular application for which processing unit 18 is configured. For example, each individual IC 20A-20C may have one or more of processing capabilities storage capabilities (e.g., memory), input/output capabilities, monitoring capabilities, management capabilities, and the like. In some examples, each individual IC only includes one function, such that each "slice" of processing unit 18 provides a respective function. When electrically connected, the different functions provided by individual ICs 20A-20C interact and cooperate to define a functional processing unit 18. Each of the individual ICs 20A-20C may incorporate open interconnect 22 such that electrical signals may be transmitted through each of the individual ICs 20A-20C, as also described in further detail below.

In the example illustrated in FIG. 1, system 10 further includes network fabric 23. Network fabric 23 may be configured in any manner suitable for facilitating communication of processed data between processing systems 12A-12N, and, in some examples, other systems. For example, processing unit 18 (or a component of processing unit 18) may transmit the processed data to network fabric 23, e.g., as illustrated by arrow 30, which may further transmit the data to another processing system 12 (e.g., processing unit 12N, as illustrated by arrow 32). Similarly, network fabric 23 may facilitate communication of data processed by other processing systems 12 to processing unit 12A, e.g., as also illustrated by double-sided arrows 30 and 32. In some examples, system 10 may include additional components such as communication interfaces, storage units, etc, and network fabric 23 may be configured to communicate the processed data to these additional components.

The modular nature of the system architecture of processing unit 18, as well as of system 10 in some examples, may provide one or more advantages. For example, the modular architecture may lower long-term development costs for system 10, processing systems 12A-12N, and processing unit 18 while increasing flexibility by partitioning technologies by change rate. Change may be, for example, a function of application as well as change in technology. In this way, the modularity of processing unit 18 may facilitate modification of only the relevant sub-component(s) (e.g., individual ICs 20) when upgrading of system 10 may become necessary. In some examples, an upgrade of system 10 may include increasing the memory capacity of processing unit 18, e.g., doubling the memory capacity, or adding a different type of storage, e.g., non-volatile storage, or supporting a new I/O interface. Each of these upgrades may be implemented by, for example, adding another modular IC to processing unit 18 by stacking the IC on top of IC 20A and interconnecting the new IC to the existing processing unit 18 via interconnects on the new IC, which are configured like open interconnect 22.

Figure 2:
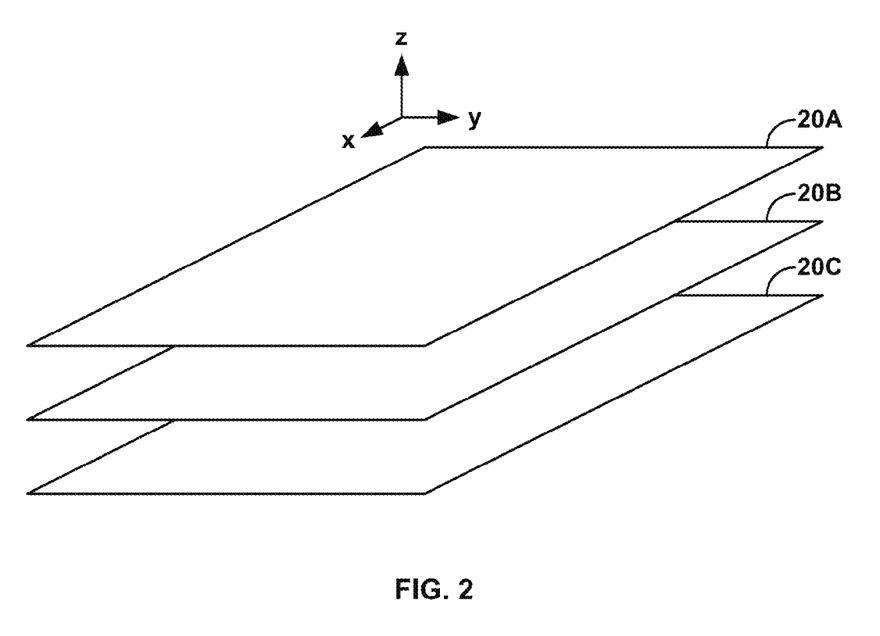
FIG. 2 is a schematic exploded view of the processing unit of FIG. 1 and illustrates three individual ICs of the processing unit.

FIG. 2 is a schematic exploded view of individual ICs 20A-20C of processing unit 18 of system 10. In some examples, at least two or all three individual IC 20A-20C are configured to perform a different function. The combination of individual ICs 20A-20C may be selected, e.g., by a designer of system 10, for a particular application of processing unit 18.

In some examples, each of individual ICs 20A-20C may be formed as part of a wafer that includes a plurality of substantially identical individual ICs. For example, each of individual ICs 20A-20C may be an IC die cut from a single wafer. ICs 20A-20C with different functions may be die cut from a respective wafer, such that each die cut from the same wafer has the same function. In some examples, individual ICs may be produced in large batches on a single semiconductor wafer of electronic-grade silicon or other semiconductor material through a process such as photolithography, and the wafer may subsequently be diced into many pieces, each of which contains a copy of the individual IC. Thus, each of individual ICs 20A-20C may result from a different wafer or at least two ICs may result from the same wafer if the ICs have the same function. However, the ICs formed from the same or different wafers have a common configuration of electrical connects, such that the interconnects of each individual IC conform to a common standard such that the ICs can be mixed and matched in any suitable number, type or order. In this way, from a plurality of different wafers, a plurality of individual ICs of different functions may be stockpiled and stored in groups of ICs having common functionality and a user may select several individual ICs of different functions from the groups of the stockpile and electrically couple them to one another to create individual application-specific processing unit, in accordance with the techniques described herein.

In some examples, cutting each of individual ICs 20A-20C from respective wafers and subsequently stacking individual ICs 20A-20C may provide advantages over a technique in which a plurality of wafers are stacked and subsequently diced. For example, selecting from individual ICs already cut from respective wafers may provide design flexibility and reduced cost by facilitating assembly of only a necessary or desired number of a particular design of processing unit, rather than the number of processing units that would result from stacking wafers and subsequently dicing the wafers into multiple processing units. In addition, a plurality of different types of processing units (e.g., incorporating various combinations of individual ICs) may result from a particular number of wafers. The types of processing units may be, for example, defined by different applications, different numbers of ICs, or combinations thereof. In contrast, techniques that include stacking multiple wafers and subsequently dicing the stacked wafers may result in many, e.g., hundreds or thousands, of the same design of processing unit from the particular number of wafers.

Individual ICs 20A-20C may be selected from a variety of individual IC types. For example, individual ICs 20A-20C may be selected from processing individual ICs, memory individual ICs, input/output (I/O) individual ICs, or monitoring and management individual ICs, as described in further detail below with respect to FIGS. 3A and 3B.

In some examples, each of individual ICs 20A-20C may have memory functionality. Using stacked memory arrays may result in lower power consumption as a result of the elimination of power-hungry input/output (I/O) buffers and I/O inductance/capacitive loads. In other examples, as described herein, each of individual ICs 20A-20C may be defined by other functionalities.

Each of the individual ICs of the stockpiled groups may be formed such that the individual IC incorporates a predetermined configuration of electrical interconnects. A configuration of the electrical interconnects may include, for example, the placement of an interconnect along the x-y plane (orthogonal x-y-z axes are shown in FIG. 2 for ease of description only), as well as the dimensions of the interconnect in the x-y plane. In some examples, a manufacturer of ICs may define an "open standard" that defines the predetermined configuration of the electrical interconnects, where each IC to be used to define modular building blocks for forming processing units follows the open standard. The predetermined configuration of interconnects may provide design guidelines that ensure a common set of communication signals are appropriately routed through each of the individual ICs in a processing stage. Even particular individual ICs that do not utilize the communication signals, e.g., that do not perform any processing of the signals, may be configured to route the signals to make them available to individual ICs above or below the particular IC that does not utilize the communication signals.

In some examples, the predetermined configuration of electrical interconnects of each of the individual ICs is defined by through-silicon vias (TSVs), which may be an electrically conductive pathway passing completely through a thickness of the IC (in the z-axis direction, which is the direction in which the IC is vertically stacked to define processing unit 18). In some examples, a TSV is defined by an aperture in the wafer that is subsequently filled with a conductive material. The TSVs may be configured such that when ICs 20A-20C (which may have identical or substantially similar sizes in the x-y plane are shown in FIG. 2) are aligned with each other, the TSVs are aligned to define a common interconnect 22 (FIG. 1). The TSVs of adjacent ICs 20A-20C may be directly electrically connected to each other (direct contact) or indirectly via an electrically conductive interface material, such an electrically conductive adhesive. In some examples, TSVs may enable an individual IC to be fabricated on much smaller die (e.g., 181 square millimeters ($mm^2$) or smaller) compared to if the processing unit was fabricated as a monolithic design.

Electrically connecting the stacked ICs 20A-20C using TSVs may permit the use of smaller ICs compared to processing units in which ICs 20A-20C are electrically connected to each other via wiring (e.g., separate leads) along their edges. In addition, compared to systems that rely solely on the separate wiring to electrically connect ICs 20A-20C, the TSVs may support a quicker and more cost efficient assembly of processing unit 18 from the stock of individual ICs. Rather than having to solder individual wires to the ICs that are to be electrically connected, ICs including TSVs may be electrically connected during the stacking of the ICs.

Figure 3A:
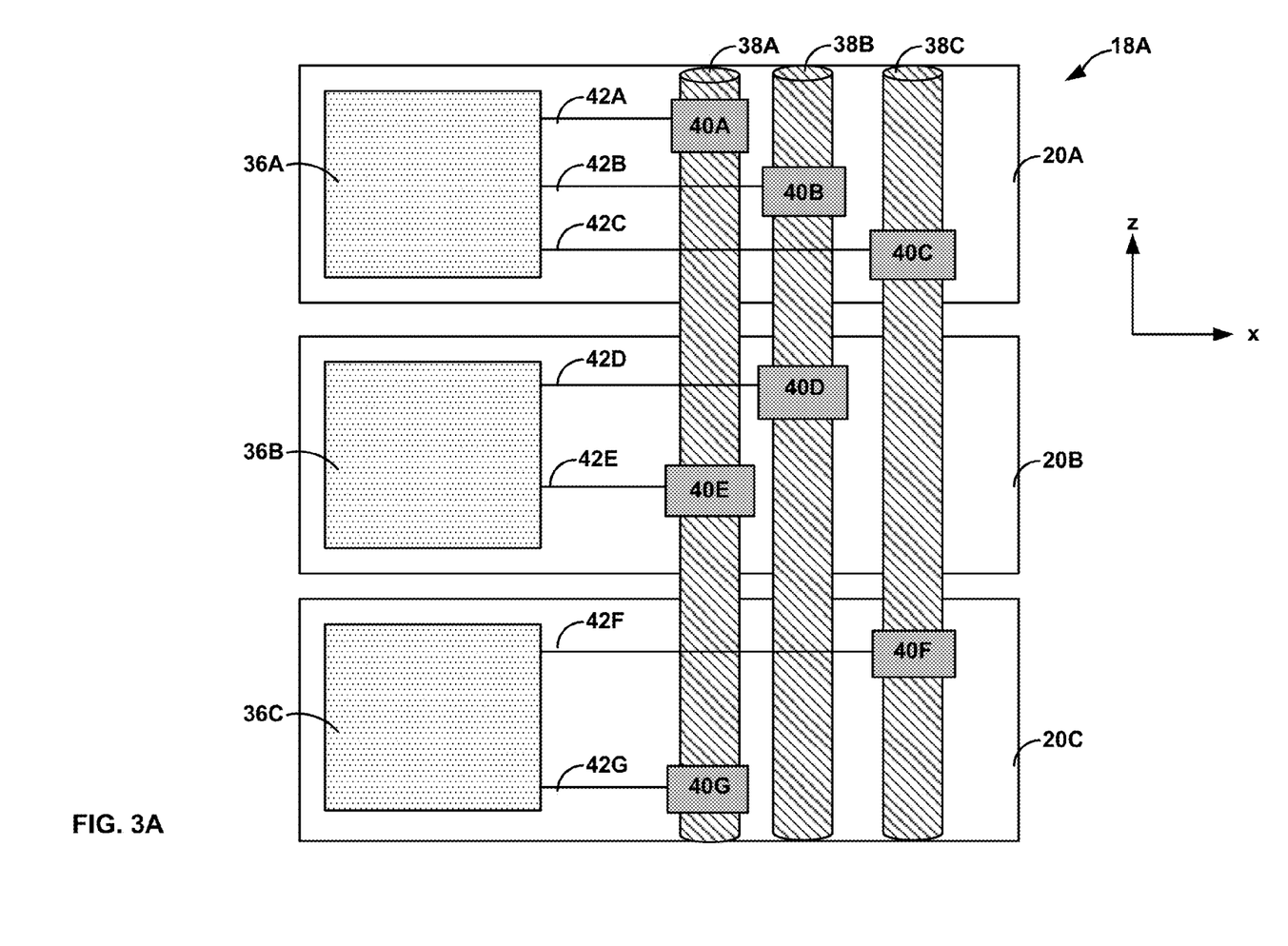
FIGS. 3A and 3B illustrate example processing units that each includes three individual ICs electrically connected by electrical interconnects arranged in a common configuration.

FIG. 3A illustrates a schematic diagram of an example processing unit 18A, which may be an example of processing unit 18 shown in FIGS. 1 and 2. In the example illustrated in FIG. 3A, each of the individual ICs 20A, 20B, and 20C includes at least one functional component 36A, 36B, and 36C, respectively. Each of the functional components 36A-36C may be configured to perform the particular function attributable to the respective individual ICs 20A-20C within which it is included. In addition, each of the functional components 36A-36C may be configured to interface and communicate with one or more electrical interconnects 38A-38C via respective interfaces 40A-40G.

In the example illustrated in FIG. 3A, individual IC 20A includes functional component 36A, individual IC 20B includes functional component 36B, and individual IC 20C includes functional component 36C. As discussed above, in some examples, at least two of the individual ICs 20A-20C may be configured to perform a different function, and functional components 36A-36C may be responsible for attributing the particular function to the individual ICs 20A-20C. For example, if individual IC 20A is configured to store data, e.g., has memory capabilities, functional component 36A may include a type of memory, such as semiconductor storage. In some examples, the memory may be random-access memory (RAM), such as static RAM (SRAM) or dynamic RAM (DRAM), or flash memory. As another example, if individual IC 20A is configured for processing data, e.g., has processing capabilities, functional component 36A may include a processor core, such as a reduced instruction set computing (RISC) processor core. Example processor cores that may be incorporated into an individual IC may be a PowerPC processor core made commercially available by International Business Machines (IBM) Corporation of Armonk, N.Y.; ARM Holdings plc of Cambridge, United Kingdom; Freescale Semiconductor, Inc. of Austin, Tex.; or MIPS Technologies, Inc. of Sunnyvale, Calif. Another example processor core may be a Xtensa LX3 customizable dataplane processing unit (DPA), made commercially available by Tensilica® of Santa Clara, Calif.

As another example, if individual IC 20A is configured for I/O functionality, functional component 36A may include a communication network such as SpaceWire or RapidIO architecture. As another example, if individual IC 20A is configured for monitoring and/or management, the functional component 36 may include thermal management components or power monitoring components.

As illustrated in FIG. 3A, in one example, processing unit 18A includes electrical interconnects 38A-38C, which may be, for example, through silicon vias defined by the individual ICs 20A-20C. Electrical interconnects 38A-38C may be configured to transmit data, e.g., in the form of an electrical signal, through and between individual ICs 20A-20C. In some examples, electrical interconnects 38A-38C may define computer buses, such as parallel buses, serial buses, high-speed buses, and/or low-speed buses. In other examples, data processing unit 18 may include a fewer or greater number of electrical interconnects configured to route signals through processing unit 18A and between the individual ICs that define processing unit 18A.

In the example illustrated in FIG. 3A, functional components 36A-36C are configured to interface with one or more electrical interconnects 38A-38C via interfaces 40A-40G and conductors 42A-42G. For example, functional component 36A of individual IC 20A is configured to interface with electrical interconnect 38A via interface 40A and conductor 42A, with electrical interconnect 38B via interface 40B and conductor 42B, and with electrical interconnect 38C via interface 40C and conductor 42C. Functional component 36B of individual IC 20B is configured to interface with electrical interconnects 38A and 38B (via interface 40D and conductor 42D, and interface 40E and conductor 42E, respectively) and is not configured to interface with electrical interconnect 38C. Similarly, functional component 36C of individual IC 20C is configured to interface with electrical interconnects 38A and 38C (via interface 40F and conductor 42F, and interface 40G and conductor 42G, respectively) and is not configured to interface with electrical interconnect 38B.

In some examples, interconnects 38A-38C may be implemented as electrically conductive regions located on the surfaces of individual ICs 20A-20C, e.g., top and/or bottom surfaces of individual ICs 20A-20C. Top and bottom surfaces of an IC may face in substantially opposite z-axis directions in the example shown in FIG. 2. In some examples, each of individual ICs 20A-20C may include a plurality of electrically conductive regions etched into one or more surfaces of the individual ICs. In some examples, each of individual ICs 20A-20C may include many electrically conductive regions, e.g., on the order of thousands or tens of thousands. The electrically conductive regions of each of the individual ICs may be arranged in a predetermined configuration (e.g., a standard configuration) such that individual ICs of different types may allow signals to pass through to communicate with one another and may be integrated into a processing unit in accordance with the techniques described herein.

The electrically conductive regions of the individual ICs may be connected to circuitry (represented by, e.g., functional components 36A-36C) of the respective individual IC via electrical conductors (e.g., conductors 42A-42G) positioned on or within the respective individual IC. In some examples, the conductors may be defined by electrically conductive traces within the individual ICs. Depending on the desired functionality of a particular individual IC, some examples may include all of the electrically conductive regions of an individual IC electrically coupled to circuitry of the individual IC via the conductors while, in other examples, only some (and not all) of the electrically conductive regions may be electrically coupled to the circuitry via the conductors. In examples in which only some of the electrically conductive regions are electrically coupled to the circuitry via the conductors in a particular individual IC, some of the conductors remain electrically uncoupled to the circuitry. These uncoupled conductors may still pass through the individual ICs in order form a common configuration of interconnects to allow signals to pass from one individual IC to another anywhere in the processing unit.

In some examples, each type of individual IC (e.g., individual IC 20A, individual IC 20B, or individual IC 20C) may include a common configuration of the electrical conductors coupled to circuitry. For example, individual IC 20A may be a first type of individual IC and all individual ICs of the same type may include the same configuration of electrical conductors. Similarly, individual ICs 20B may be a second type of individual IC including a second configuration of electrical conductors and individual IC 20C may be a third type of individual IC including a third configuration of electrical conductors, and all individual ICs of the second and third types may include the second configuration of electrical conductors and third configuration of electrical conductors, respectively.

As described above with respect to FIG. 1, processing unit 18 includes interconnect 22. In relation to the example configuration of processing unit 18A illustrated in FIG. 3A, interconnect 22 may be defined by electrically connected electrical interconnects 38 of the individual ICs. Slices 20A-20C may be communication with each other via the electrically connected interconnects 38 and the respective interfaces 40.

As discussed above, even particular individual ICs that do not utilize one or more signals transmitted through interconnect 22, e.g., individual ICs 20B and 20C of FIG. 3A, may be configured to route the signals to make them available to individual ICs above or below the particular IC that does not utilize the signals.

In some examples, individual ICs 20A-20C of data processing unit 18 may be enclosed within a common integrated circuit package, after assembly of application-specific processing unit 18. In some examples, the integrated circuit package may have a package base within which the individual ICs 20A-20C may be positioned and a package lid to substantially enclose (e.g., completely or nearly completely enclose) the individual ICs 20A-20C within the IC package. The package may also include a plurality of input and/or output components such that signals may be transmitted to and/or from one or more of the individual ICs 20A-20C, e.g., from signal processing stage 16 illustrated in FIG. 1.

In some examples, the integrated circuit package may be configured for wire bonding such that conductors extend from one or more of individual ICs 20A-20C through the integrated circuit package and may be coupled to one or more components outside of the IC package. In this way, an integrated circuit package that incorporates wire bonding may allow for input and/or output of signals from any of the individual ICs 20A-20C of processing unit 18. In other examples, the integrated circuit package may incorporate another suitable means for electrical coupling to an external component, such as a printed board. For example, the integrated circuit package may incorporate a ball grid array, such as a flip-chip ball grid array, which may facilitate electrical coupling of external components to a top or bottom surface of the IC package.

Although the examples described herein incorporate individual ICs stacked vertically in a three-dimensional (3-D) configuration, in other examples, ICs may be positioned in a planar configuration, e.g., side-by-side. When the ICs are positioned in a planar configuration, the ICs may be stacked vertically in a 3-D configuration (e.g., as shown in FIG. 3A) in addition to being positioned in a side-by-side configuration (e.g., in the x-axis direction). For example, two or more individual ICs may be mounted to a common substrate (e.g., a silicon substrate or a ceramic substrate), side-by-side. Because the individual ICs may include a common configuration, interconnects of a first individual IC may be routed through the common substrate to corresponding interconnects of a second individual IC such that one or more signals may pass through each of the individual ICs. The interconnects may be routed using conductive material passing through the substrate from one interconnect to another. In some examples, this routing of interconnects may be similar to that used to route electrical signals through a printed board. However, in some examples, the interconnects of the substrate may be on a smaller scale as a result of the size of the individual ICs.

In some examples, the processing units described herein may include a combination of individual ICs stacked vertically and horizontally (e.g., in a planar configuration). Such a configuration may decrease a signal path length between the ICs of the processing unit or otherwise decrease the impedance of circuits through the processing unit, which may improve efficiency of the processing unit. This configuration may also help to decrease heat generated during operation of the processing unit, which may be useful for preventing overheating of the processing unit. In addition, a processing unit that includes a combination of individual ICs stacked vertically and horizontally (e.g., in a planar configuration) may improve the dissipation of heat during the operation of the processing unit, e.g., by increasing the number of thermally conductive pathways for heat to conduct away from the processing unit compared to a configuration that includes only vertically stacked ICs.

Figure 3B:
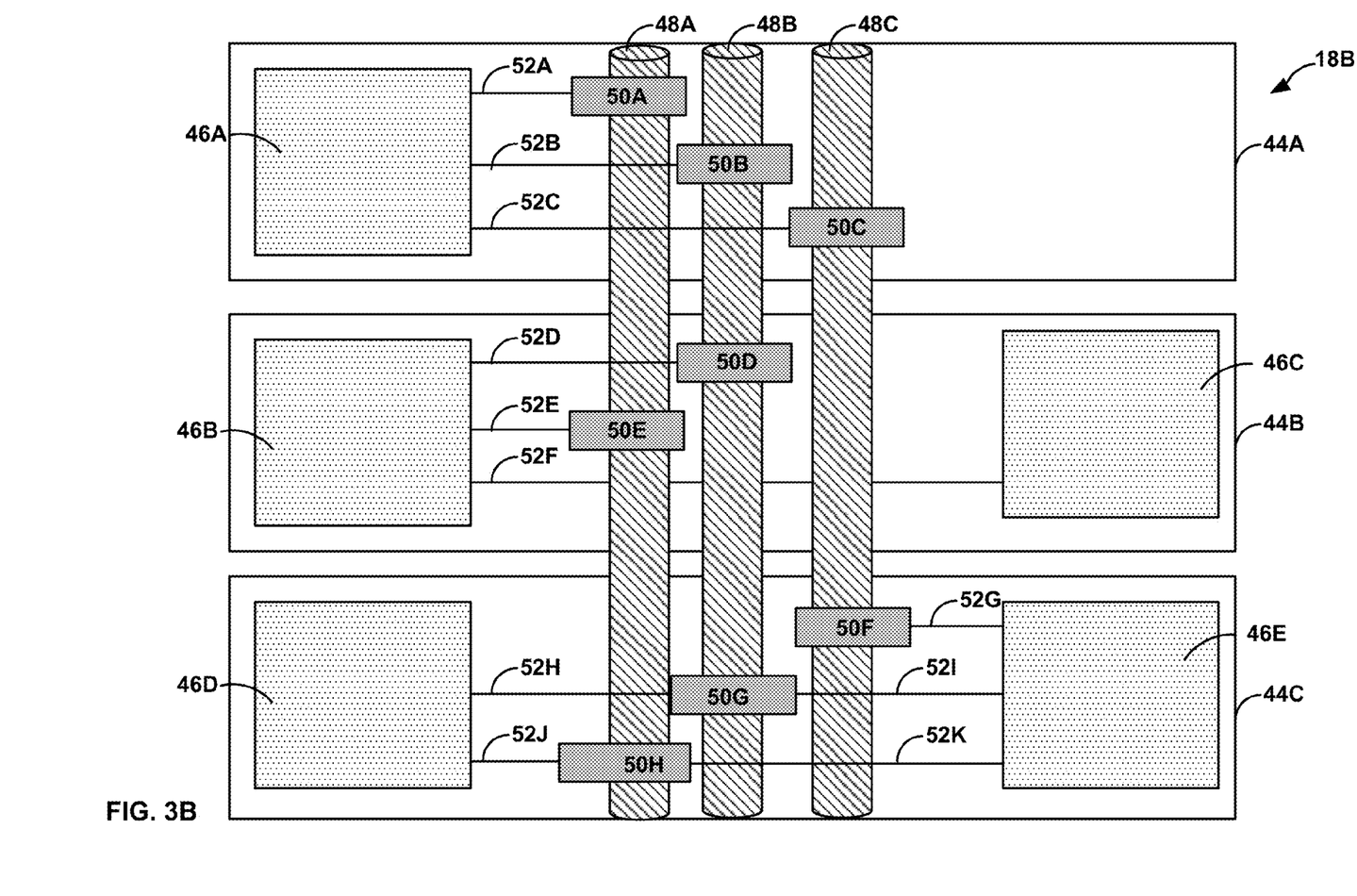

FIG. 3B illustrates another example processing unit 18B, which is another example of processing unit 18 of FIGS. 1 and 2. Processing unit 18B illustrates a more detailed example of a processing unit that includes several individual ICs 44A-44C (e.g., similar to ICs 20A-20C) electrically coupled to one another by a predetermined interconnect configuration. In the example described herein, individual IC 44A is configured for input/output of signals, individual IC 44B is configured to store data (e.g., has memory capabilities), and individual IC 44C has processing capabilities. In addition, in some examples, interconnect 48A defines a high-speed bus, interconnect 48B defines a low-speed bus, and interconnect 48C may route additional signals through processing unit 18B. Interconnects 48A-48C may be similar to interconnects 38A-38C of FIG. 3A.

As illustrated, individual IC 44A includes functional component 46A. Functional component 46A may be configured for I/O operations, in order to attribute I/O capabilities to processing unit 18B. For example, functional component 46A may include logic configured for use with a particular communication network. As an example, in examples in which processing unit 18B is configured for use in aerospace applications, functional component 46A may be SpaceWire logic configured to allow processing unit 18 to communicate via a standard SpaceWire network. As shown in FIG. 3B, functional component 46A is configured to communicate with electrical interconnects 48A-48C via interfaces 50A-50C and conductors 52A-52C, which may be substantially similar to interfaces 40A-40C and conductors 42A-42C of FIG. 3A.

As illustrated, individual IC 44B includes two functional components 46B and 46C. Functional components 46B and 46C may be configured for storage operations, in order to attribute memory capabilities to individual IC 44A. For example, functional component 44B may be a memory controller configured to manage the flow of data to and from functional component 44C, which may be a memory component. As an example, functional component 44B may be a SRAM memory controller configured to manage the flow of data to and from signal-transmitting components 48A and 48B to functional component 44C, which may include SRAM or DRAM. In the example shown in FIG. 3B, functional component 46B is configured to communicate with signal-transmitting components 48A and 48B via interfaces 50D and 50E and conductors 52D and 52E, respectively, which may be substantially similar to interfaces 40D and 40E and conductors 42D and 42E, respectively, of FIG. 3A. In addition, as shown in FIG. 3B, individual IC 44B also includes conductor 52F, which may be configured such that functional component 46B (which may be a memory controller) may communicate with, e.g., manage the flow of data to and from, functional component 46C (which may be a memory component). Thus, conductor 52F may not be in communication with any of signal-transmitting components 48A-48C, but may instead be a communication link between two functional components 46B and 46C internal to IC 44B.

As illustrated, individual IC 44C includes two functional components 46D and 46E. Functional components 46D and 46E may be configured for processing operations, in order to attribute processing capabilities to processing unit 18B. For example, functional component 46D may be a PowerPC processor core, and functional component 46E may be an external memory controller. In the example illustrated in FIG. 3B, functional component 46D is configured to communicate with electrical interconnects 48A and 48B via interfaces 50G and 50H and conductors 52H and 52J, respectively. In addition, functional component 46E may be configured to communicate with electrical interconnects 48A, 48B, and 48C via interfaces 50H, 50G, and 50F and conductors 52K, 52I, and 52G, respectively. Thus, data processing unit 18 may include interfaces, e.g., interfaces 50G and 50H, configured to communicate with multiple functional components. Interfaces 50G and 50F may be substantially similar to interfaces 40G and 40F, and conductors 52H, 52J may be similar to conductors 42F and 42G, respectively, of FIG. 3A.

In some examples, the individual ICs described herein include functional components, which may reduce the complexity of processing units formed from the ICs, and may result in reduced cost, reduced schedule, and greater yield of new individual IC designs compared to system-on-chip processing units. In addition, the processing units formed from modular ICs may provide system-on-chip capabilities, which may reduce the amount of external components required and improve Size, Weight, and Power (SWAP) in system 10. That is, the techniques described herein may facilitate tailoring of a processing unit to meet system performance and efficiency needs in a cost and schedule efficient way, without the cost and schedule burden that may be associated with developing some custom system-on-chip application-specific integrated circuits (ASICs). For example, the resulting processing units may provide inherent power management through custom configurations, e.g., customers may include only the desired modules within the processing unit. Additionally, because the processing units may be customized for a particular application, the resulting processing units need not include individual ICs that are not necessary for the particular application.

Figure 4:
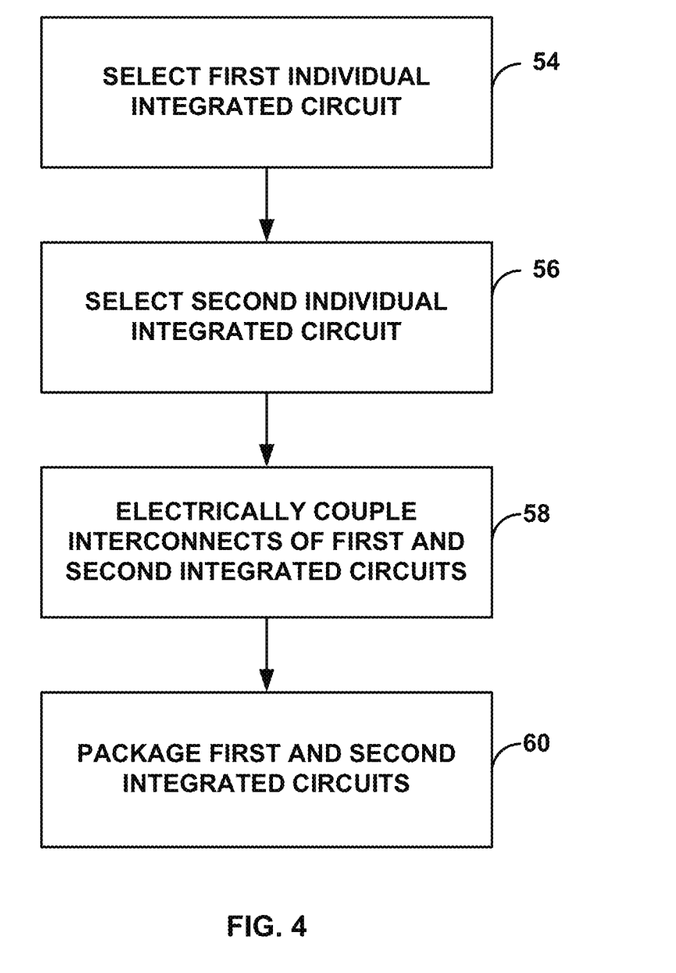
FIG. 4 is a flow diagram illustrating an example technique for forming a processing unit from a plurality of modular integrated circuits.

FIG. 4 is a flow diagram illustrating an example technique for forming a processing unit, such as processing unit 18, which may be an application specific processing unit. Although FIG. 4 is described with respect to a user performing the technique, in other examples, one or more manufacturing systems, such as the manufacturing system illustrated in FIG. 5, may perform some or all the steps of the technique, automatically or in combination with a user. In addition, although FIG. 4 is described with respect to processing unit 18, in other examples, the technique shown in FIG. 4 can be used to form other processing units from individual modular ICs, such as more than three modular ICs (e.g., four, five, six or more ICs).

Prior to performance of the technique illustrated in FIG. 4, the components required for assembling a processing unit may be manufactured. For example, a designer may determine a configuration for the common configuration of electrical interconnects which may be incorporated into each of the individual ICs. Subsequently, a plurality of different types (e.g., two or more types, such as three types in the example shown in FIG. 4) of ICs may be manufactured with the predetermined interconnect configuration. In some examples, each of the types of ICs is configured to perform a different function. Each type of IC may be formed on a wafer level, which is then diced to define a plurality of individual ICs with the respective function. In some examples, a facility may store an inventory of the different types of individual ICs (post-dicing of the wafer), and processing units with the individual ICs may be formed using the stored inventory, as described below.

According to the technique illustrated in FIG. 4, the user may select a first IC 20A from a first group of individual ICs (54). Each of the individual ICs of the first group of individual ICs may be configured to perform a first function. For example, each of the individual ICs of the first group may be configured for processing, memory, input/output, or monitoring and management capabilities, as described above.

The user may subsequently select a second individual IC 20B from a second group of individual ICs (56). Each of the individual ICs of the second group of individual ICs may be configured to perform a second function different than the first function. In this way, the second individual IC may be a different type than the first individual IC. In some examples, each of the individual ICs of the second group may be configured for processing, memory, input/output, or monitoring and management capabilities, as described above.

As discussed above, each individual integrated circuit of the first and second groups may comprise a plurality of electrical interconnects arranged in a predetermined configuration. According to the technique illustrated in FIG. 4, after selecting the first and second individual ICs 20A and 20B, respectively, the user may electrically couple the plurality of interconnects of individual IC 20A and individual IC 20B (58). For example, the first IC and the second IC may be aligned such that the respective electrical interconnects align (e.g., in the x-y plane) and directly or indirectly electrically connect to each other. In this way, application-specific processing units may be formed from groups of stored, modular and individual ICs by selecting individual ICs having the desired functions. Because the predetermined configuration of the plurality of interconnects is consistent between each of the individual ICs of the first and second groups of individual ICs, the stored ICs of various functions may substantially fully interoperable, regardless of the ASIC technology from which the IC is formed. For example, a memory IC may be fabricated on a different feature size and process than a processor IC, but because of the common interconnect configuration, the memory IC and processor IC may be fabricated in a common processing unit.

Although the examples described herein primarily include data processing units comprising two or three individual ICs, it shall be understood that application-specific processing units assembled in accordance with the disclosure may include any suitable number and types of individual ICs, such as four, five or more individuals ICs.

In some examples, the reliability of the assembled processing units described herein may be improved, in comparison to conventional techniques, because the stored individual ICs may be tested prior to assembly of the processing unit, and testing of individual ICs may be more efficient than testing an already-assembled processing unit. In addition, storing a plurality of modular individual ICs of various functions may permit a manufacturer to support a variety of different customers' needs, which may result in cost efficiency for both the manufacturer and the customer. For example, the customer may be able to order only one or a handful (e.g., less than 50) of application-specific processing units (e.g., for testing purposes), instead of ordering hundreds or thousands, which may result from forming a processing unit on a wafer level and subsequently dicing the stacked wafers. Additionally, the techniques described herein may facilitate mixing of technologies such that the customer is not required to buy a preset processing unit. In some cases, there may be no single processing technology that is appropriate for every application, and the techniques described herein facilitate creation of application-specific processing units using multiple different technology platforms. For example, some technologies may be ideally suited to the characteristics of signal processing but may be relatively inefficient for data processing while, in other examples, the opposite may be true.

In addition to electrically coupling the individual ICs to one another, the user may, in some examples, mechanically couple the first and second individual ICs to one another. For example, the user may apply an electrically insulative material, such as an adhesive material (e.g., an electrically insulative epoxy) in order to mechanically couple each of the first and second individual ICs to one another in a stacked configuration. In other examples, the user may utilize another suitable material for mechanically coupling the individual ICs to one another.

Upon electrically coupling individual ICs 20A and 20B to one another, the user may package individual ICs 20A and 20B (60), using any suitable packaging technique known in the art. For example, an IC package may be formed using multilayer co-fired ceramic packaging technology or multilayer laminate organic packaging technology.

In some examples, individual ICs 20A-20C may be vertically stacked (e.g., in the z-axis direction, as shown in FIG. 2), and each individual IC 20A, 20B, or 20C may be electrically coupled to the package via at least one respective wire. In some examples, each individual IC may be electrically coupled to the package via a plurality of wires that provide an electrical connection between a respective electrical contact on the respective individual IC and an electrical contact on the IC package base. The package base may define a planar surface on which the stack of individual ICs 20A-20C may be positioned, and wires may connect each individual IC to contacts on the planar surface of the package base in order to supply each individual IC with power and a signal connection.

The IC package may be formed from any suitable materials. For example, the IC package may comprise an electrically conductive material such as aluminum silicon carbide (AlSiC), copper tungsten (CuW), copper molybdenum (CuMo), a nickel cobalt ferrous alloy (e.g., an alloy provided under the trademark Kovar®, made available by Carpenter Technology Corporation of Reading Pa.), or the like. As another example, the IC package may include an electrically insulating ceramic material, such as aluminum oxide, aluminum nitride (AlN), beryllium oxide (BeO), and silicon carbide (SiC). In some examples, the IC package may also include materials that are thermally conductive. As another example, the IC package may include a polymeric material, such as a polytetrafluoroethylene (PTFE)/ceramic based laminate (e.g., Rogers RO2800 laminate, which is made commercially available by Rogers Corporation of Rogers, Conn.) or fluoropolymer materials (e.g., fluoropolymers made commercially available by W.L. Gore and Associates of Newark, Del.), FR-4, BT-Epoxy, or polyimide.

Figure 5:
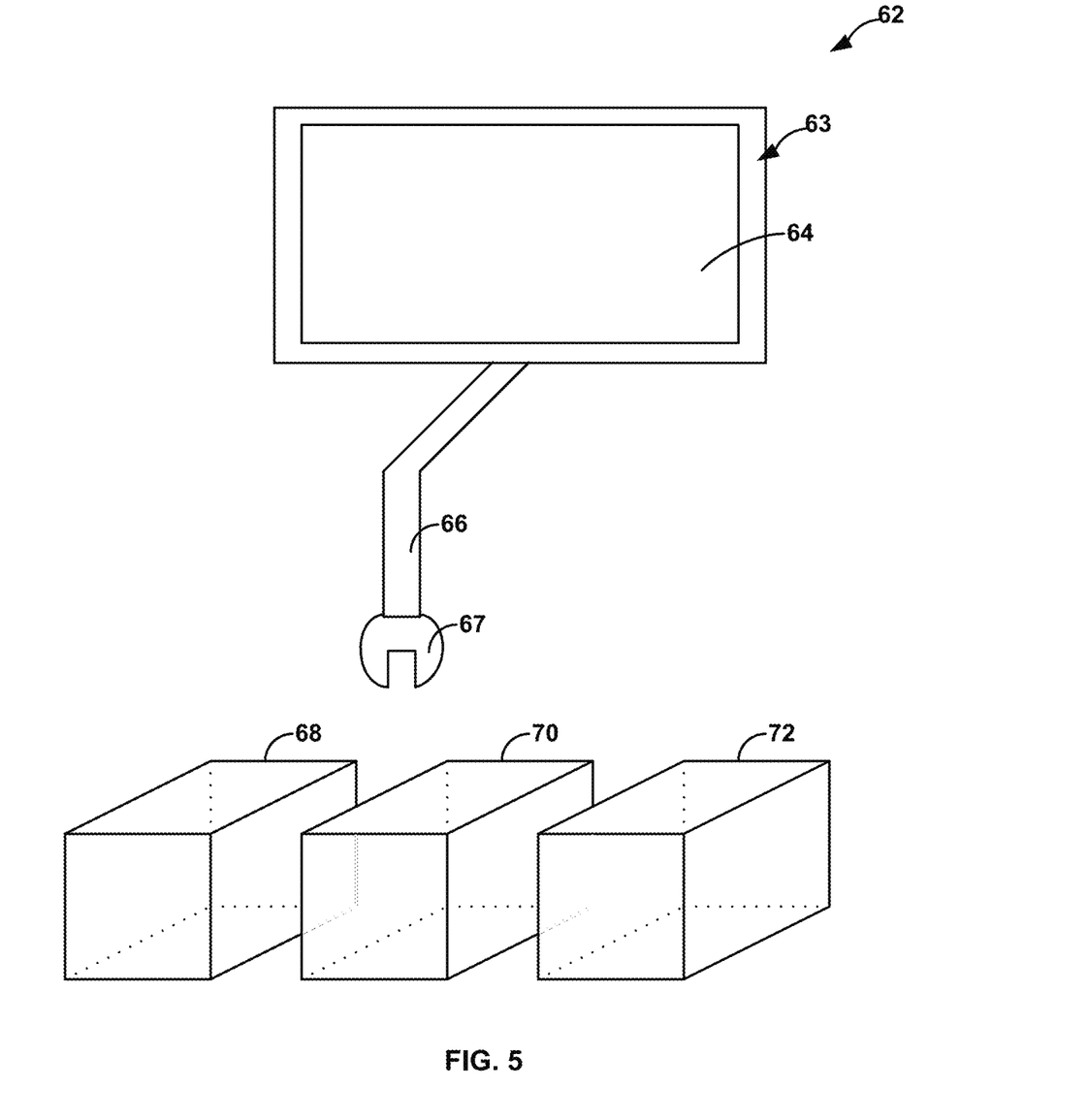
FIG. 5 is a schematic diagram illustrating an example system configured to perform the technique of FIG. 4.

FIG. 5 illustrates a conceptual diagram of an example manufacturing system 62 that can be configured to automatically assemble a processing unit from a plurality of modular ICs, e.g., using the technique discussed with respect to FIG. 4. In the example shown in FIG. 5, system 62 includes example manufacturing device 63 which includes user interface 64 and movable arm 66 coupled to claw 67. Movable arm 66 and claw 67 may be, for example, part of a computer controlled robotic arm. Movable arm 66 may be configured to extend in different directions and claw 67 may be configured to pick up and carry objects (e.g., individual ICs) between two points.

User interface 64 may include a display, such as a liquid crystal display or a light emitting diode display or other type of display screen, that is configured to present information related to assembly of a processing unit to a user. In some examples, user interface 64 may include buttons and a keypad, and the buttons may be dedicated to performing a certain function, i.e., a power button, or the buttons and the keypad may be soft keys that change function depending upon the section of the user interface 64 currently viewed on the display of user interface 64 by the user. Instead, or in addition, the display (not shown) of user interface 64 may be a touch screen that allows the user to provide input directly to the user interface shown on the display. The user may use a stylus or a finger to provide input to the display. In other examples, user interface 64 also includes audio circuitry for providing audible instructions or notifications to the user and/or receiving voice commands from the user.

In some examples, manufacturing device 63 may be configured to receive user input, via user interface 64, regarding desired characteristics of an application-specific processing unit. Manufacturing device 63 may include a processor configured to initiate or perform the technique of FIG. 4 based on the received user input. The processor can include any one or more microprocessors, digital signal processors (DSPs), application specific integrated circuits (ASICs), field programmable gate arrays (FPGAs), or any other equivalent integrated or discrete logic circuitry, as well as any combinations of such components.

In one example, a user may provide input related to a particular application for which the processing unit is to be implemented, e.g., specifying the particular application and/or specifying various types of individual ICs that may be useful for the particular application. As an example, the user may input criteria for radiation hardening levels of components (e.g., memory or a processor) included in the processing unit (e.g., by selecting different levels of cell hardness, different levels of error detection and correction (EDAC), or both), the size of the memory to be included in the processing unit, the processing speed of a processor IC included in the processing unit, and the like. In some examples, the processor of device 63 presents a list of available types of ICs or component specifications (e.g., memory size, processing speeds, radiation hardening levels, and the like) for the user to select from, and the user may select from the available types of ICs or component specifications for the processing unit.

By providing input, via user interface 64, indicating the desired characteristics for a processing unit, the user (e.g., a customer) may interact with manufacturing device 63 to customize a processing unit to meet a particular set of performance and efficiency needs, without the cost and schedule burden of developing a custom system-on-chip ASIC or purchasing a preset processing unit. This may be useful if, for example, there is no single existing processing technology that can efficiently cover the processing requirements of the customer. Some technologies may be ideally suited to the customer's requirement for signal processing, yet may be inefficient for data processing, while for other customers, the opposite may be true. In addition, some customers may choose to balance speed and radiation performance.

In some examples, in response to receiving the user input, the processor within manufacturing device 63 may identify two or more types of individual ICs (e.g., resulting from the dicing of a wafer into the individual ICs), e.g., two or more of individual ICs 20A-20C, that met the user's inputted requirements. For example, in response to a request from the user for a 128 megabit DRAM, processor 63 may select an IC with 128 megabit DRAM functionality. In the example illustrated in FIG. 5, bin 68 may store a plurality of individual ICs of a first type configured to perform a first function, bin 70 may store a plurality of individual ICs of a second type configured to perform a second function, and bin 72 may store a plurality of individual ICs of a third type configured to perform a third function. That is, each bin 68, 70, 72 may store a different group of ICs. The first, second, and third types of ICs are different in some examples. Each of the individual ICs stored in bins 68, 70, and 72 may include a plurality of interconnects arranged in the same predetermined configuration such that substantially all of the individual ICs from bins 68, 70, and 72 may be interoperable. In this way, manufacturing device 63 may create application-specific data processing stages from the individual ICs in bins 68, 70, and 72.

After determining that, for example, a first type of IC and a second type of IC are needed to fabricate the processing unit, the processor of manufacturing device 63 may subsequently control movable arm 66 to obtain a first individual IC from a first group of individual ICs, e.g., the group of individual ICs stored in bin 68, and to obtain a second individual IC from a second group of individual ICs, e.g., the group of individual ICs stored in bin 72. For example, movable arm 66 may, with the aid of claw 67, pick one individual IC from bin 68 and another individual IC from bin 72. As previously mentioned, the first and second groups of individual ICs are configured to perform different functions.

Upon obtaining the first and second individual ICs, claw 67 may, in some examples, deposit the first and second individual ICs on an assembly line (not shown), and one or more users or manufacturing devices may electrically couple the plurality of interconnects of the first individual IC to the plurality of interconnects of the second individual IC such that at least one common electrical signal may be transmitted through both the first and second individual ICs via the plurality of interconnects. In other examples, claw 67 may itself electrically couple the plurality of interconnects of the first individual IC to the plurality of interconnects of the second individual IC (e.g., including stacking the individual ICs), under the control of the processor of manufacturing device 63. In some examples, manufacturing device 63 or another component of system 62 may enclose the electrically coupled individual ICs within a common integrated circuit package, using any suitable technique.

The techniques described in this disclosure, including those attributed to manufacturing device 63, or various constituent components, may be implemented, at least in part, in hardware, software, firmware or any combination thereof. For example, various aspects of the techniques may be implemented within one or more processors, including one or more microprocessors, DSPs, ASICs, FPGAs, or any other equivalent integrated or discrete logic circuitry, as well as any combinations of such components, embodied in programmers, such as physician or patient programmers, stimulators, image processing devices or other devices. The term "processor" or "processing circuitry" may generally refer to any of the foregoing logic circuitry, alone or in combination with other logic circuitry, or any other equivalent circuitry.

Such hardware, software, and/or firmware may be implemented within the same device or within separate devices to support the various operations and functions described in this disclosure. When implemented in software, the functionality ascribed to the systems, devices and techniques described in this disclosure may be embodied as instructions on a computer-readable medium such as random access memory (RAM), read only memory (ROM), non-volatile RAM (NVRAM), electrically erasable programmable ROM (EEPROM), flash memory, magnetic data storage media, optical data storage media, or the like. The instructions may be executed to support one or more aspects of the functionality of manufacturing device 62 or other devices described in this disclosure.

Various examples have been described. These and other examples are within the scope of the following claims.

What is claimed is:

1. A method comprising:
receiving, by a processor, input from a user selecting characteristics of a processing unit;
selecting, by the processor, a first individual integrated circuit from a first group of individual integrated circuits based on the selected characteristics, wherein each individual integrated circuit of the first group is configured to perform a first function;
selecting, by the processor, a second individual integrated circuit from a second group of individual integrated circuits based on the selected characteristics, wherein each individual integrated circuit of the second group is configured to perform a second function different than the first function, and wherein each individual integrated circuit of the first and second groups comprises a plurality of interconnects arranged in a common predetermined configuration; and
electrically coupling the plurality of interconnects of the first integrated circuit to the plurality of interconnects of the second integrated circuit, wherein electrically coupling the plurality of interconnects of the first integrated circuit to the plurality of interconnects of the second integrated circuit facilitates transmission of at least one common electrical signal through the first and second integrated circuits via the plurality of interconnects.

2. The method of claim 1, further comprising enclosing at least the electrically coupled first and second integrated circuits within a common integrated circuit package.

3. The method of claim 1, wherein the first function comprises at least one of processing, storage, input/output, monitoring, or management operations and the second function comprises a different one of the processing, storage, input/output, monitoring, or management operations.

4. The method of claim 1, wherein the selected characteristics of the processing unit comprise at least one of: a radiation hardening level of a component, a level of cell hardness, a level of error detection and correction, a size of a memory, or a processing speed.

5. The method of claim 1, wherein the first function comprises a data processing function and the second function comprises a storage function, the method further comprising:
selecting, by the processor, a third integrated circuit from a third group of individual integrated circuits based on the selected characteristics, wherein each individual integrated circuit of the third group is configured to perform an input/output function; and
selecting, by the processor, a fourth integrated circuit from a fourth group of individual integrated circuits based on the selected characteristics, wherein each individual integrated circuit of the fourth group is configured to perform a device management function, and wherein each individual integrated circuit of the third and fourth groups comprises a plurality of interconnects arranged in the common predetermined configuration.

6. A system comprising:
a first group of individual integrated circuits, wherein each individual integrated circuit of the first group is configured to perform a first function;
a second group of individual integrated circuits, wherein each individual integrated circuit of the second group is configured to perform a second function different than the first function, wherein each individual integrated circuit of the first and second groups comprises a plurality of interconnects arranged in a common predetermined configuration;
a user interface configured to receive input from a user selecting characteristics of a processing unit;
a movable arm; and
a processor configured to control the movable arm to select a first individual integrated circuit from the first group of individual integrated circuits based on the selected characteristics and control the movable arm to select a second individual integrated circuit from the second group of individual integrated circuits based on the selected characteristics.

7. The system of claim 6, wherein the processor is further configured to control the movable arm to electrically couple the plurality of interconnects of the first integrated circuit to the plurality of interconnects of the second integrated circuit, wherein electrically coupling the plurality of interconnects of the first integrated circuit to the plurality of interconnects of the second integrated circuit facilitates transmission of at least one common electrical signal through the first and second integrated circuits via the plurality of interconnects.

8. The system of claim 7, wherein the processor is further configured to control the movable arm to enclose at least the electrically coupled first and second integrated circuits within a common integrated circuit package.

9. The system of claim 6, wherein each of the first and second individual integrated circuits comprises at least one functional component configured to attribute functional characteristics to the respective first or second individual integrated circuit.

10. The system of claim 6, wherein the plurality of interconnects comprise through silicon vias.

11. The system of claim 6, wherein the system comprises a plurality of groups of individual integrated circuits, each group being associated with a respective function, wherein each individual integrated circuit of each group is configured to perform the function associated with the respective group, and wherein the plurality of groups comprises the first group and the second group, and
wherein the processor is configured to determine, based on the selected characteristics and the respective functions associated with the plurality of groups of individual integrated circuits, which groups of individual integrated circuits are associated with functions that achieve the selected characteristics of the processing unit, and to control the movable arm to obtain at least one individual integrated circuit from each group of the plurality of groups determined to achieve the selected characteristics of the processing unit.

12. The system of claim 11, wherein the plurality of groups of integrated circuits comprises at least one group associated with a data processing function, at least one group associated with a storage function, at least one group associated with an input-output function, and at least one group associated with a device management function.

13. The system of claim 11, wherein the first function comprises a data processing function and the second function comprises a storage function, wherein the processor is configured to control the movable arm to select a third integrated circuit from a third group of individual integrated circuits based on the selected characteristics and select a fourth integrated circuit from a fourth group of individual integrated circuits based on the selected characteristics, wherein each individual integrated circuit of the third group is configured to perform an input/output function and each individual integrated circuit of the fourth group is configured to perform a device management function, and wherein each individual integrated circuit of the third and fourth groups comprises a plurality of interconnects arranged in the common predetermined configuration.

14. The system of claim 6, wherein the first function comprises at least one of processing, storage, input/output, monitoring, or management operations, and the second function comprises a different one of the processing, storage, input/output, monitoring, or management operations.

15. The system of claim 6, wherein the selected characteristics of the processing unit comprise at least one of: a radiation hardening level of a component, a level of cell hardness, a level of error detection and correction, a size of a memory, or a processing speed.

16. The system of claim 6, wherein the first function comprises a memory function, each integrated circuit of the first group including random-access memory (RAM).

17. The system of claim 6, wherein the characteristics of the processing unit comprise a first characteristic of the processing unit and a second characteristic of the processing unit, and wherein the processor is configured to control the movable arm to select the first individual integrated circuit from the first group of individual integrated circuits based on the first characteristic and control the movable arm to select the second individual integrated circuit from the second group of individual integrated circuits based on the second characteristic.

18. A system comprising:
means for receiving input from a user selecting characteristics of a processing unit;
means for selecting a first individual integrated circuit from a first group of individual integrated circuits based on the selected characteristics, wherein each individual integrated circuit of the first group is configured to perform a first function;
means for selecting a second individual integrated circuit from a second group of individual integrated circuits based on the selected characteristics, wherein each individual integrated circuit of the second group is configured to perform a second function different than the first function, and wherein each individual integrated circuit of the first and second groups comprises a plurality of interconnects arranged in a predetermined configuration; and
means for electrically coupling the plurality of interconnects of the first integrated circuit to the plurality of interconnects of the second integrated circuit, wherein electrically coupling the plurality of interconnects of the first integrated circuit to the plurality of interconnects of the second integrated circuit facilitates transmission of at least one common electrical signal through the first and second integrated circuits via the plurality of interconnects.

19. The system of claim 18, wherein each of the first and second individual integrated circuits comprises at least one functional component configured to attribute functional characteristics to the respective first or second individual integrated circuit.

20. The system of claim 18, further comprising means for selecting the first and second groups of individual integrated circuits from a plurality of groups of integrated circuits, each group being associated with a respective function, wherein each individual integrated circuit of each group is configured to perform the function associated with the respective group, and wherein the plurality of groups comprises at least one group associated with a data processing function, at least one group associated with a storage function, at least one group associated with an input-output function, and at least one group associated with a device management function.

* * * * *